United States Patent
Jones et al.

[11] Patent Number: 6,131,279
[45] Date of Patent: Oct. 17, 2000

[54] INTEGRATED MANUFACTURING PACKAGING PROCESS

[75] Inventors: Gerald Walter Jones, Apalachin; Ross William Keesler, Endicott; Voya Rista Markovich, Endwell; William John Rudik; James Warren Wilson, both of Vestal; William Earl Wilson, Waverly, all of N.Y.

[73] Assignee: International Business Machines Corporation, Armonk, N.Y.

[21] Appl. No.: 09/005,182

[22] Filed: Jan. 8, 1998

[51] Int. Cl.⁷ .................................................. H01K 3/10
[52] U.S. Cl. ................................ 29/852; 29/846; 29/847
[58] Field of Search ........................... 29/846, 847, 852; 427/96, 97; 428/901; 216/90, 108, 100, 103; 361/790, 795

[56] References Cited

U.S. PATENT DOCUMENTS

| | | |
|---|---|---|
| 3,356,786 | 12/1967 | Helms . |
| 4,179,800 | 12/1979 | Takaba et al. . |
| 4,535,388 | 8/1985 | Kraus et al. . |
| 4,554,405 | 11/1985 | Varker . |
| 4,581,679 | 4/1986 | Smolley . |
| 4,598,166 | 7/1986 | Neese . |
| 4,863,808 | 9/1989 | Sallo . |
| 5,097,593 | 3/1992 | Jones et al. . |
| 5,209,817 | 5/1993 | Ahmad et al. . |
| 5,268,260 | 12/1993 | Bantu, et al. . |
| 5,354,593 | 10/1994 | Grandmont et al. . |
| 5,461,203 | 10/1995 | Blackwell et al. . |

FOREIGN PATENT DOCUMENTS

| | | |
|---|---|---|
| 5-218645 | 8/1993 | Japan . |
| 7-45948 | 2/1995 | Japan . |
| 9-331152 | 12/1997 | Japan . |

*Primary Examiner*—Valencia Martin-Wallace
*Assistant Examiner*—Binh An Nguyen
*Attorney, Agent, or Firm*—Scully, Scott, Murphy & Presser; Lawrence R. Fraley, Esq.

[57] ABSTRACT

A process of fabricating a circuitized substrate is provided which comprising the steps of: providing an organic substrate having circuitry thereon; applying a dielectric film on the organic substrate; forming microvias in said dielectric film; sputtering a metal seed layer on the dielectric film and in said microvias; plating a metallic layer on the metal seed layer; and forming a circuit pattern thereon.

22 Claims, 3 Drawing Sheets

INTEGRATED MANUFACTURING PACKAGING PROCESS

TECHNICAL FIELD

The present invention relates to a process of fabricating a circuitized structure, e.g. a circuit board, laminated chip carrier or card, by combining laminate technology with substrate technology. Specifically, by combining these two technologies in a single process, as is done herein, a circuitized structure having fine features and a high wire density is formed.

PRIOR ART

Conventional printed circuit cards and boards utilize drilled and plated through holes for communication between opposite sides and intermediate layers of the board to wiring formed on both sides of the board. Frequently, the plated through holes will also receive pins for the connection of various types of circuit components. It is usually required that the plated through holes be able to act as a soldering socket for a module and that requires that they be fairly large and that a solderable ring or land of metal be provided around the plated through holes on the surface of the circuit board so as to allow for soldered connections.

This type of structure dictates that a large amount of card or board space cannot be used for point to point wiring since the wiring must be done in the spaces between the holes, leaving room between the individual wire lines and between the wire lines and the solder rings.

Recently, there has been introduced surface modules and thin film chip wiring devices that do not have pins but have other types of connection pads. With this type of structure the space necessary for the holes can be reduced somewhat; nevertheless even with this technology a significant amount of space is used by the holes which is not available for surface wiring.

Different techniques have been suggested for various types of wire interconnection wherein plated through holes are present on the board. For example, U.S. Pat. No. 3,356,786 describes a technique where conducting lines can be provided which extend across various openings or holes. This technique, however, has many limitations both in the structures available and the utilization of the holes. Other patents that describe techniques for increasing somewhat the wiring density, are U.S. Pat. Nos. 4,554,405, 4,581,679, 4,535,388, 4,598,166, 4,179,800. None of these references combine laminate technology with substrate technology. Thus, the prior art processes cannot readily achieve fine line features on the circuitized substrate using a single process.

In view of the drawbacks mentioned hereinabove, there is a continued need to develope new processes for improving the wiring density of circuitized structures.

SUMMARY OF THE INVENTION

One object of the present invention is to provide a process of fabricating a circuitized structure having multiple inner planes of a laminate and a high wiring ldensity.

Another object of the present invention is to provide a process which fabricates a circuitized structure containing fine line circuitry.

A further object of the present invention is to provide a process of fabricating a circuitized structure having uniform line impedance across multiple parts of connected ground planes providing a system which has reduced electronic noise.

These as well as other objects are achieved by the present process which combines laminate technology and substrate technology in a single process. Specifically, the present invention relates to a process of fabricating a circuitized structure, e.g. a circuit board, laminated chip carrier or card, having fine line circuitry thereon. More specifically, the present invention comprises the steps of:
  (a) applying a dielectric film to at least one surface of an organic substrate having circuity thereon;
  (b) forming microvias in selective portions of said dielectric film;
  (c) sputtering a metal seed layer on said dielectric film and in said inicrovias;
  (d) plating a metallic layer on said metal seed layer; and
  (e) forming outer circuitry on said plated metallic layer.

Preferred dielectric films that are employed in the present invention include, but are not limited to, dielectric films that contain a photoimageable layer or dielectric films which are capable of forming microvias when exposed to laser irradiation.

In one embodiment wherein a dielectric film containing a photoimageable layer is employed, the process of the present invention comprises the steps of:
  (a) providing a dielectric film having a photoimageable layer therein;
  (b) laminating said photoimageable layer of said dielectric film to at least one surface of an organic substrate having circuitry thereon;
  (c) exposing said photoimageable layer of said dielectric film to a pattern of radiation to selectively harden portions of said photoimageable layer;
  (d) providing microvias in said photoimageable layer which is not harden by step (c);
  (e) curing said structure providing in step (d);
  (f) sputtering a metal seed layer on said cured structure and in said microvias;
  (g) plating a metallic layer on said metal seed layer; and
  (h) forming outer circuitry from said metallic layer provided in step (g).

On the other hand, when a dielectric film that is capable of forming microvias when exposed to laser irradiation is employed in the present invention, the following steps are utilized:
  (a) applying a dielectric film that is capable of forming microvias upon exposure to laser energy to at least one surface of an organic substrate having circuitry thereon;
  (b) forming microvias in selective portions of said dielectric film by irradiating the same with laser energy;
  (c) cleaning said microvias to remove any laser debris;
  (d) sputtering a metal seed layer on said dielectric film and in said microvias;
  (e) plating a metallic layer on said metal seed layer; and
  (f) forming outer circuitry from said metallic layer provided in step (e).

No matter which of the above processes is employed in the present invention, it is emphasized that a seed layer containing a metal such as Cr, Cu and the like is sputtered on to the surface of the dielectric film and in the microvias. By "seed layer" it is meant that a very thin metal layer of less than about 2000 Å is sputtered on the surface of said dielectric film and in said microvias. This seed layer is distinguishable from a full metal layer wherein the thickness is typically greater than about 0.2 mils.

DETAILED DESCRIPTION OF THE INVENTION

Figure 1A:
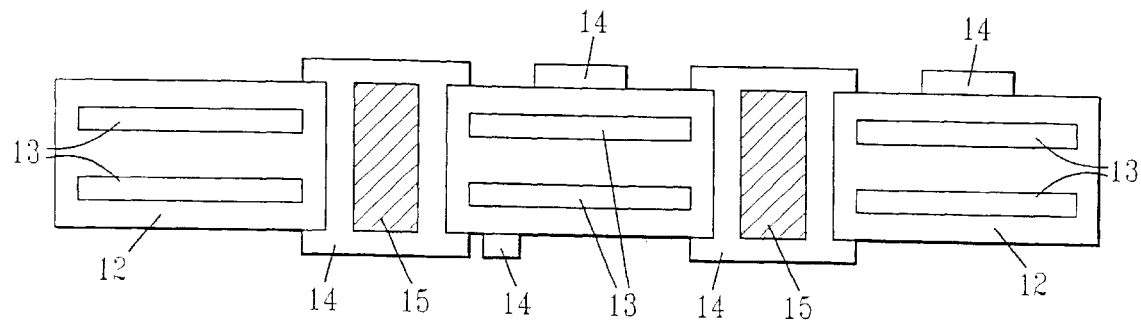
FIGS. 1(a)–1(e) show cross-sectional views of a circuitized structure after different processing steps of the present invention using a dielectric film having a photoimageable layer therein.

The present invention which provides a process of fabricating circuitized structures, such as circuit boards, cards, panels, laminated chip carriers and the like, will now be described in detail with reference to the accompanying drawings wherein like reference numerals are used for like and corresponding elements of the drawings.

Figure 2A:
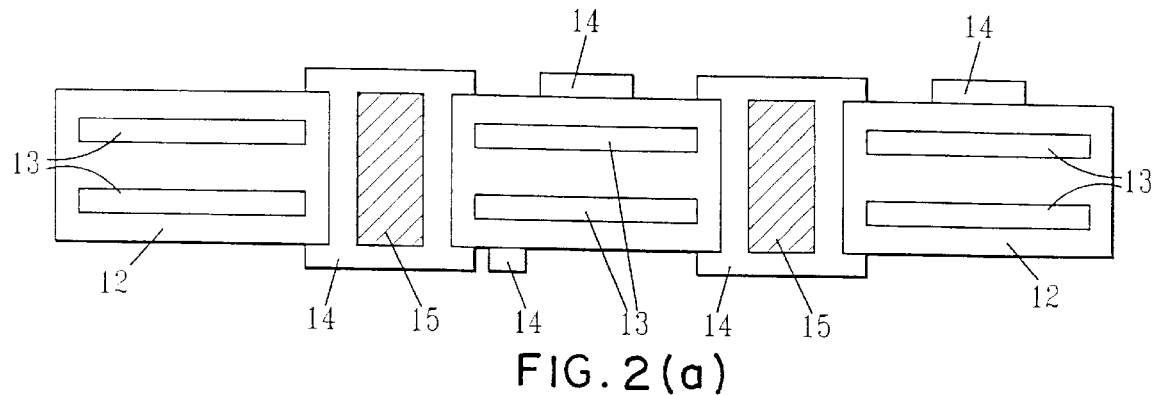
FIGS. 2(a)–(c) show cross-sectional views of a circuitized structure after different processing steps of the present invention using a dielectric film that is capable of forming microvias when exposed to laser irradiation.

Referring first to FIGS. 1(a) and 2(a), there are shown an organic substrate 12 having circuit elements 14 (hereafter "circuitry 14") formed on the top and bottom surface thereof. In the drawings of the present invention, circuitry 14 is shown as a discontinuous layer wherein portions of organic substrate 12 are covered with circuitry 14 and other portions are left exposed. Substrate 12 is also shown as containing inner planes 13.

The organic substrates employed in the present invention are conventional organic substrates that are normally employed in fabricating circuit boards, laminated chip carriers or circuit cards. Typically, the organic substrate is formed of a brominated epoxy resin impregnated in glass cloth. Other organic substrates contemplated by the present invention include, but are not limited to, all thermoset or thermoplastic materials that are generally employed as ircuit boards or cards.

Circuitry 14 on organic substrate 12 is formed using conventional processes that are well known to those skilled in the art. An example of such a process is described in "Printed Circuits Handbook", C. Combs 2nd, 1979, Publisher MacGraw Hill, particularly Section 2, Chapters 5–8, the contents of which are summarized hereinbelow. Specifically, circuitry 14 is provided to organic substrate 12 by laminating a metal foil such as Cu, Cr and the like to the organic substrate using techniques well known to those skilled in the art. If desired, the metal foil may be thinned using conventional etching techniques well known to those skilled in the art.

Holes are drilled entirely through the substrate providing means for communication between opposite sides and intermediate layers of the substrate. The substrate and holes are then plated with a metallic element such as Cu, Cr, W and the like using conventional plating techniques well known to those skilled in the art. The plated through holes are then filled with an epoxy resin containing Cu paste and thereafter the structure is planarized by using conventional techniques well known to those skilled in the art, e.g. nub removal or chemical mechanical polishing. The Cu may be thinned down or removed, if desired. After the substrate has been planarized, it is plated again to provide metal on top of the filled plated through holes. The filled portions of the plated through holes are designated as 15 in the drawings.

Fine features are then formed on the subcomposite structure provided above using conventional photolithographic techniques which include, but are not limited to, providing a photoresist to the surface of the subcomposite structure, exposing the photoresist pattern, developing the photoresist, etching with $CuCl_2$ and stripping the photoresist.

The top surface metallurgy of the structure shown in FIGS. 1(a) or 2(a) is then treated to increase the adhesion of circuitry 14 for a dielectric film. This treatment consists of processes well known to those skilled in the art and includes, but is not limited to, mechanical roughening with pumice and vapor blast, chemical roughening with etchants and oxide treatments, and chemical adhesion promoters such as silane coupling agents. A preferred treatment for Cu is black oxide which is formed by the action of an oxidizing agent such as sodium chlorite with Cu.

A dielectric film is then applied onto one surface of substrate 12 having circuitry 14 thereon using conventional techniques well known to those skilled in the art. Preferred techniques for applying the dielectric film to substrate 12 are by vacuum lamination (for dry films) and screen coating, spray coating or curtain coating (for liquid dielectric films).

The dielectric films that are employed in the present invention are conventional dielectric materials that are well known to those skilled in the art. They can comprise aqueous compositions, solvent processable compositions as well as those that form vias by laser ablation, i.e. from exposure to laser irradiation. The embodiment of using a dielectric film having a photoimageable layer, as is shown in FIGS. 1(a)–(e) will be described first followed by the embodiment of using e dielectric film that is capable of being laser ablated (shown in FIGS. 2(a)–(c)).

Turning to the embodiment shown in FIGS. 1(a)–(e), when the dielectric film contains a photoimageable layer, the photoimageable layer of said dielectric film is laminated, preferably by vacuum lamination, to one surface of organic substrate 12. A preferred dielectric film employed in the present invention comprises a photoimageable epoxy based resin layer that is sandwiched between a polyolefin layer and a peelable polyester layer. It should be noted that polyolefin layer, e.g. polypropylene, polyethylene, polybutylene and the like, is removed prior to its use and is thus not present in the process of the present invention. The polyester resin that may be used in the present invention as the peelable layer must be optically clear. An example of a clear peelable polyester resin that can be employed is MYLAR®. Since the peelable polyester layer is removed after laminating the dielectric film to substrate 12, it is not shown in FIGS. 1(a)–(e).

Although the drawings of FIGS. 1(a)–(e) of the instant application and the description given below are specific to using a dielectric film comprising a photoimageable epoxy based resin layer, other dielectric films containing a layer that is photoimageable may be employed in the instant invention.

The photoimageable cationically polymerizable epoxy based resin layer of the dielectric film is comprised of solids and solvent. The solids are preferably comprised of an epoxy resin system which comprises from about 10% to about 80% by weight, preferably 20% to 40% by weight, more preferably about 30% by weight, of a phenoxy polyol resin which is a condensation product of epichlorohydrin and bisphenol A having a molecular weight of between about 40,000 and about 130,000, preferably about 60,000 to about 90,000, more preferably greater than about 60,000; from about 20% to about 90% by weight, more preferably from about 25% to about 30% by weight, most preferably about 25% by weight, of an epoxidized multifunctional bisphenol A formaldehyde novolac resin having a molecular weight of from about 4,000 to about 10,000, preferably about 5,000 to about 7,000; from about 0% to about 50% by weight, preferably from about 35% to about 50% by weight, more preferably about 45% by weight, of a halogenated, preferably brominated, diglycidyl ether of bisphenol A having a molecular weight of from about 600 to about 2,500, preferably about 1,000 to about 1,700; and from about 0.1 to about 15 parts, preferably about 5 parts, by weight of the total epoxy resin of a cationic photoinitiator capable of initiating polymerization of said epoxy based resin system. The solvent component of the epoxy based resin system employed in the present invention is comprised of propylene glycol monomethyl ether acetate and 0 to less than about 10% propylene carbonate. The propylene carbonate is preferably the carrier for the photoinitiator.

Preferably, the phenoxy polyol resin has an epoxide value of from about 0.001 to about 3, more preferably about 0.03 equivalents per kg, a weight per epoxide of from about 10,000 to about 60,000, more preferably from about 20,000 to about 50,000, most preferably about 37,000 and a glass transition temperature of from about 80° C. to about 150° C., more preferably from about 90° C. to about 110° C., most preferably about 98° C.

Preferably, the multifunctional epoxy bisphenol A formaldehyde novolac resin has an epoxide value of from about 1 to about 10, more preferably from about 3 to about 6, most preferably about 4.7 equivalents per kg, a weight per epoxide of from about 180 to about 300, more preferably from about 190 to about 230, most preferably about 215 and a melting point of from about 60° C. to about 150° C., more preferably from about 70° C. to about 90° C., most preferably about 82° C.

Preferably, the diglycidyl ether of the halogenated bisphenol A, has an epoxide value of from about 0.1 to about 5, more preferably from about 1 to about 3, most preferably about 1.5 equivalents per kg, a weight per epoxide of from about 200 to about 1000, more preferably from about 500 to about 750, most preferably 675 and a melting point of from about 70° C. to about 150° C., more preferably from about 80° C. to about 110° C., most preferably about 97° C.

A suitable phenoxy polyol resin is available under the tradename "PKHC", formerly available from Union Carbide Corporation, now available from Phenoxy Resin Associates. A suitable multifunctional bisphenol A, formerly available under the tradename Epirez-SU-8 from High Tek Polymers, is now available as "Epon 1183" from Shell Oil Company. A suitable complex triarylsulfonium hexafluoroantimonate salt photoinitiator, formerly available under the tradename 1014 from General Electric Company, is now available as "UVI-6974" from Union Carbide.

It should be noted that the epoxy based resin system of the present invention in the steps before developing has an elevated solvent content of an amount sufficient to prevent cracking and provide plasticity to the dielectric film during handling and to assist flow of the dielectric film during lamination with the subcomposite. By "elevated solvent content" it is meant that the solvent amount in the epoxy based resin system ranges from about 5% to about 30% by weight, preferably from about 9% to about 15%, more preferably from about 11.5% to about 13%.

After laminating the dielectric film to substrate 12, the peelable support film is removed, the dielectric film is baked at a temperature of from about 70° to about 110° C. for a period of time of from about 10 minutes to about 45 minutes and then the photoimageable epoxy based resin layer is exposed to a pattern of radiation under conditions effective to selectively harden portions of the photoimageable epoxy based resin layer. Preferred baking conditions employed in the present invention are as follows: temperature=about 90° C., time=30 minutes.

The selective hardening process is carried out by overlaying a photo-master on top of the photoimageable epoxy based resin layer and then using a conventional exposure device operating at a photo-master contact pressure of from about 3 to about 8 psi, an energy of from about 800 to about 2000 millijoules/cm$^2$ using a 365 nanometer arc 8 Kilowatt lamp. More preferably, the exposure is carried out at a photo-master pressure of from about 4 to about 6 psi, an energy of from about 1000 to about 1500 millijoules/cm$^2$ using a 365 nanometer arc 8 Kilowatt lamp. The most preferred conditions for providing the selective hardening effect to the photoimageable layer are 5 psi, 1500 milliJoules/cm$^2$, using an 8 Kilowatt lamp.

Microvias are then formed in areas of the structure that are not exposed to the pattern of radiation. Typically, microvias are formed over areas containing circuitry 14 by baking and developing the unexposed photoimageable layer.

Specifically, the photoimageable epoxy based resin layer is baked at temperatures which are effective to crosslink and toughen the photoimageable layer. Specifically, baking is conducted at temperatures of from about 100° C. to about 140° C. for a time period of from about 15 to about 120 minutes. More preferably, baking is conducted at temperatures of from about 120° C. to about 130° C. for a time period of about 30 to about 60 minutes. Partial curing of the photoimageable layer is obtained in this step of the present invention. It is noted that the above conditions lower the amount of solvent that is present in the photoimageable layer.

The baked structure is then developed using conditions which are well known in the art. Typically, the structure, particularly the photoimageable layer, is developed using an organic solvent that dissolves any unexposed material. Generally, the pattern is developed by conventional methods which. include, but are not limited to, using propylene carbonate, gamma butyrolactone, diglyme or mixtures thereof. A highly preferred method of developing the photoimageable layer in the present invention is disclosed in U.S. Pat. No. 5,268,260, the contents of which are incorporated herein by reference.

It should emphasized that the development process produces microvias 18 having a diameter of from about 1 to about 5 mils, more preferably about 3 to about 5 mils, in the photoimageable layer. Thus, the structure of the present invention contains fine holes which extend to circuitry 14 that is located on the surface of substrate 12.

Following development, the photoimageable layer is exposed to a blanket exposure process using a UV cure tool that operates at a high UV energy. By "high UV energy" it is meant that the blanket exposure step is conducted at energies of from about 2 to about 6 Joules/cm$^2$, more preferably about 4 Joules/cm$^2$.

Permanent curing of the structure is carried out at temperatures of from about 150° C. to about 190° C. for a time period of from about 30 to about 120 minutes. More preferably, the final cure is carried out at temperatures of about 160° C. to about 180° C. for about 45 to about 90 minutes. The permanently cured structure of the present invention containing microvias 18 and cured photoimageable layer 16 is shown in FIG. 1(b).

Figure 1B:
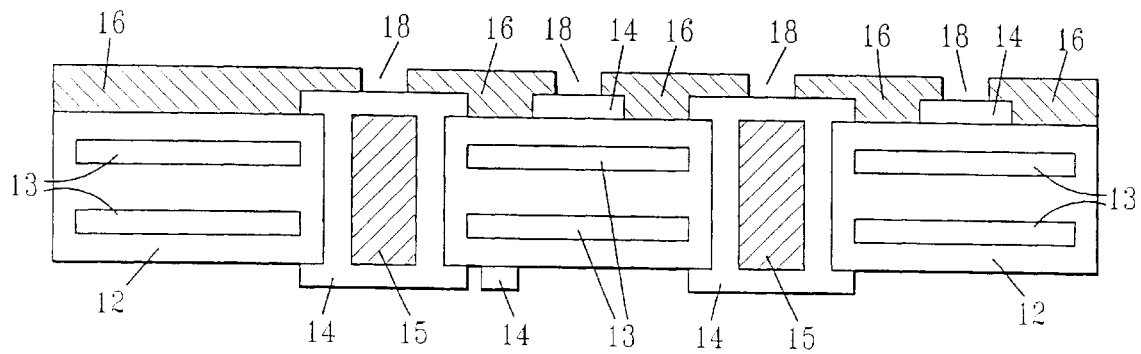

Prior to conducting the next step of the present invention, the structure shown in FIG. 1(b) may be roughened using conventional techniques well known to those skilled in the art to improve the adhesion of a metal layer to the surface of the structure. Such roughening techniques are the same as those previously described hereinabove.

Figure 1C:
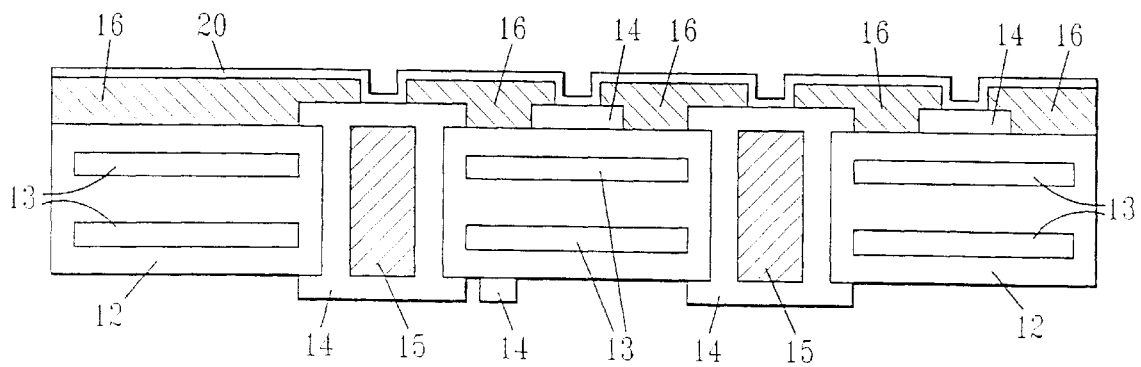

Next, a metal seed layer 20 is sputtered on to the surface of photoimageable film 16 and in microvias 18. This step of the present invention is shown in FIG. 1(c). Suitable metals that may be sputtered in this step of the present invention include, but are not limited to, Cr, Cu, Al and the like. Mixtures or alloys of these metals are also contemplated herein. Also contemplated herein is the use of two distinct metal layers. When such an embodiment is employed, it is preferred that a layer of Cr be applied first followed by a layer of Cu.

The sputtering conditions employed in the present invention are effective to cause the formation of a metal seed layer on the surface of the developed photoresist film and in the microvias. As stated hereinabove, the term "metal seed layer" denotes a metal layer which has a thickness of from about 100 to about 2000 Å. More preferably, the metal seed layer has a thickness of from about 500 to about 1500 Å. It is again emphasized that a metal seed layer is distinguishable from a full metal layer which typically has a thickness of from about 0.2 to about 0.5 mils. Applying such a full metal layer to the surface of the cured photoimageable layer would be detrimental to the structure provided in the previously mentioned steps since high sputtering temperatures and full sputtering cycle times would be required in forming such a full metal layer.

The sputtering conditions employed in the present invention which are effective in providing the metal seed layer are as follows: the energy is from about 0.48 to about 0.72 kW, the temperature from about 1000° to about 150° C., and the time is from about 12 to about 18 minutes. More preferably, sputtering is carried out at an energy from about 0.54 to about 0.66 kW, a temperature of from about 112° to about 138° C. and for a time period of from about 13 to about 17 minutes.

Figure 1D:
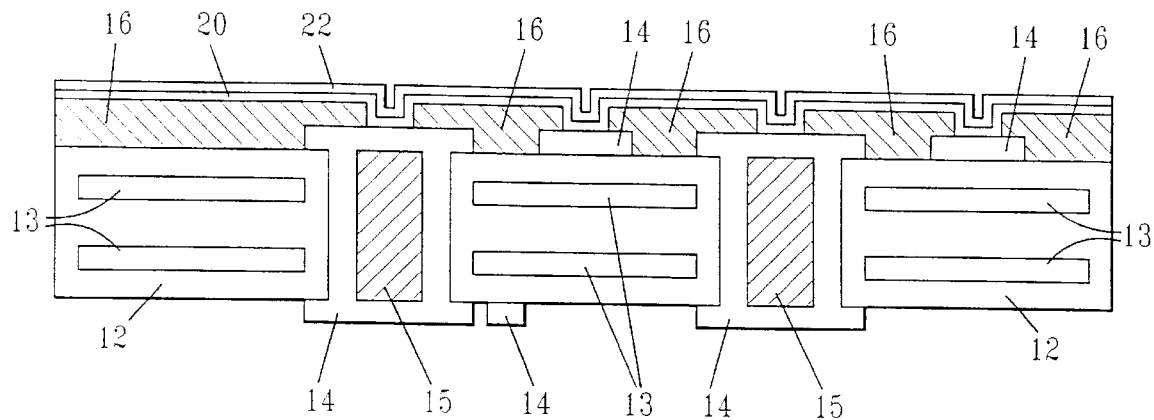

The next step of the present invention is shown in FIG. 1(d). Specifically, FIG. 1(d) shows plating a metallic layer 22 on sputtered metal seed layer 20. Typically, the plated metallic layer 22 is composed of a metal selected from the-group consisting of Cu, Al, Cr, W and the like. Of these metals, Cu is highly preferred in the present invention for forming metallic layer 22.

The metal plating is conducted utilizing plating techniques and conditions well known to those skilled in the art. For example, when Cu is employed as metallic layer 22, it is plated from an acid electroplating bath which typically contains copper sulfate in aqueous sulfuric acid. In accordance with the present invention, the plating process provides a metallic layer on top of the metal seed layer which has a thickness of from about 0.2 to about 0.5 mils.

Figure 1E:
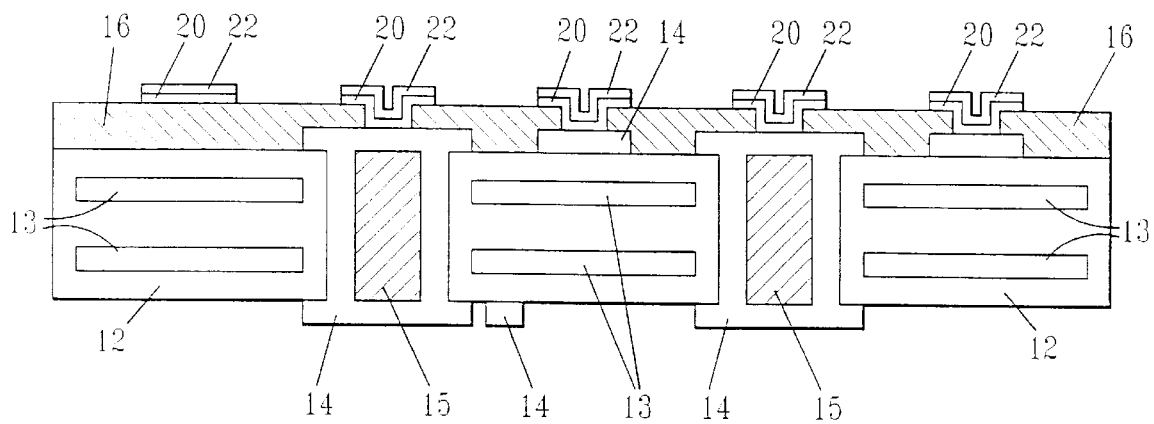

A circuit pattern is then formed in metallic layer 22 utilizing substrate techniques well known to those skilled in the art. This includes providing a photoresist film (dry or liquid application) on plated metallic layers 20 and 22, exposing and developing the photoresist film; and etching down the plated metallic layers 20 and 22. The final structure containing outer circuitry which comprises plated metallic layer 22 and metal seed layer 20 is shown in FIG. 1(e).

The photoresists employed in forming the circuit pattern in metallic layer 22 are conventional photoresists well known to those skilled in the art. A preferred photoresist for this step of the present invention is WAYCOAT SC-100 which is a liquid photoresist.

The photoresist used in providing the circuit pattern to metallic layer 22 is exposed and developed using the same conditions and techniques well known to those skilled in the art. The circuit pattern is then formed by using conventional etching techniques.

Another way of providing the circuitry to the structure is by first sputtering a layer of Cr onto metallic layer 22. Next, a liquid photoresist is applied to the surface of the sputtered Cr layer and then the photoresist is exposed and developed using conventional techniques well known to those skilled in the art so that a pattern is provided to the photoresist. Thereafter, the exposed regions of sputtered Cr and metallic layers 22 and 20 are etched as described above. After etching, the photoresist is stripped from the sputtered Cr. For clarity, this embodiment is not shown in the drawings of the present invention.

The etching step employed in forming the circuit pattern in metallic layer 22 in step (h) of the present invention is conducted using either a dry etch or a wet etch. Suitable dry etching techniques that may be employed in the present invention include reactive ion etching (RIE), chemical dry etching, ion beam etching (IBE) and plasma etching.

When a wet etch is employed to etch the metallic layer, the chemical etchant employed is selected from the group consisting of $H_2O_2$, chromic acid, cupric chloride, ferric chloride, potassium permanganate and the like. Mixtures of these chemical etchants with water are also contemplated herein. The chemical etchant may also be buffered to a desired pH using known buffering agents. A preferred chemical etchant employed in the present invention is cupric chloride, ferric chloride or potassium permanganate.

In a second embodiment of the present invention, process steps (a)–(g) as mentioned hereinabove are first performed on both sides of the substrate 12 providing cured photoimageable epoxy based layers 16, microvias 18, metal seed layers 20 and plated metallic layers 22 on both sides thereof. It is noted that this structure would be similar to the one shown in FIG. 1(b) except that layers 16, 20 and 22 would be present on the bottom surface of the structure as well as the top.

Circuit layers are then formed in metallic layers 20 and 22 using one of the following embodiments. In one embodiment, the outer circuitry is formed by applying a photoresist to both surfaces of metallic layers 20 and 22; exposing and developing both sides of the structure and then subjecting the exposed areas to etching. In another embodiment., the circuitry is formed by providing a photoresist to both sides of the structure; exposing the circuitry on one side; blanket exposing the other side; developing the structure; etching the side of the structure that is developed; stripping the developed photoresist; and then repeating these steps on the reverse side.

As stated above, the foregoing description and FIGS. 1(a)–(e) are illustrative of the processing steps employed in the present invention when the dielectric film contains a photoimageable layer. The description that follows applies to cases wherein the dielectric film is one that is capable of forming microvias upon exposure of the same to laser irradiation. This aspect of the present invention is shown in FIGS. 2(a)–(c).

Turning first to FIG. 2(a), there is shown an organic substrate 12 having circuitry 14 formed on the top and bottom surface thereof. The organic substrate and means used in forming the circuitry are the same as mentioned previously in regard to FIG. 1(a).

Next, a dielectric layer that is capable of forming microvias when exposed to laser irradiation is applied to at least one surface of organic substrate 12. In one embodiment of the present invention, a suitable dielectric such as an unsupported epoxy or, Aramid resin is coated onto Cu foil. The foil is then laminated to one or both sides of the core layer in a lamination press. The foil is then etched to expose the dielectric layer wherein selected portions of the dielectric layer are irradiated with a beam of laser energy under conditions which are effective to form microvias in the structure. Such conditions are well known to those skilled in the art. The surface of the dielectric film is then irradiated with the laser until microvias are formed therein. Typically, a 18×24 inch board can be imaged at a rate of about 3000 vias per minute. Preferred laser sources that can be employed in the present invention include $CO_2$, Nd-YAG, Excimer and the like. Both $CO_2$ and UV lasers will ablate glass fibers as well as organic dielectric materials therefore standard FR-4 and other suitable glass reinforced dielectric materials may be used in a similar fashion.

Figure 2B:
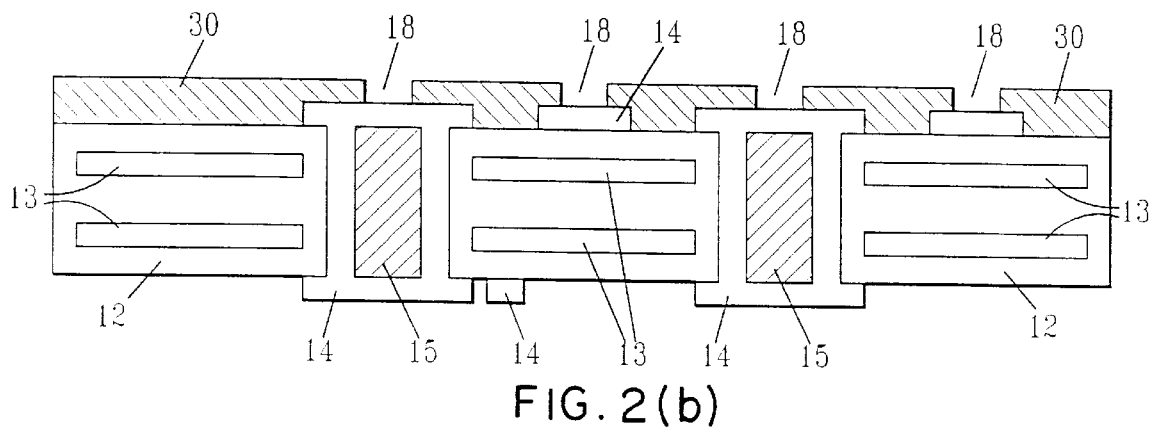
Figure 2C:
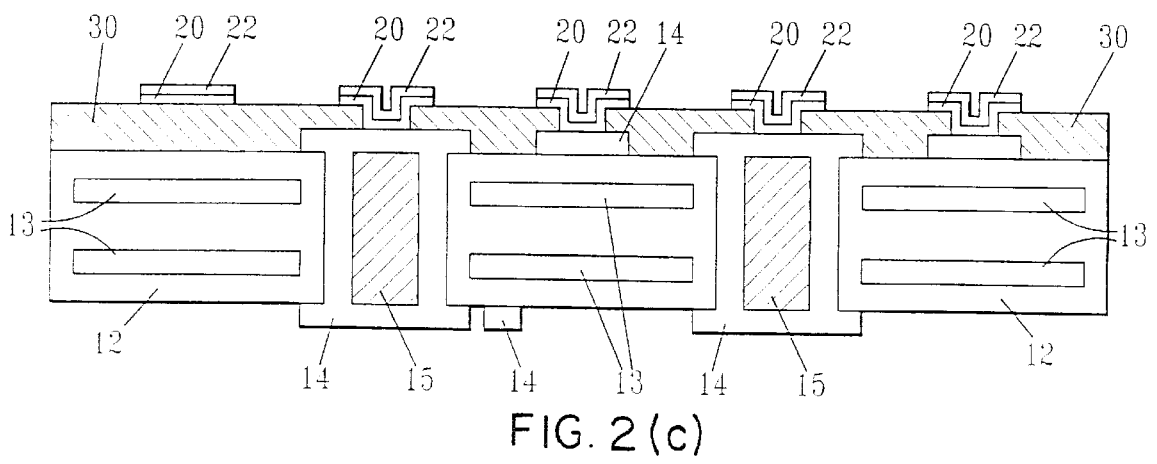

FIG. 2(b) shows the structure formed after exposure to laser energy. As is seen therein, microvias 18 are formed in dielectric film 30 over metal layer 14. The structure shown in FIG. 2(b) is then subjected to a conventional hole clean process so as to remove any laser debris that may be present in the microvias or the plated through holes. It should be noted that laser ablated stops at circuitry 14 since said circuitry typically contains a metallic layer such as Cu which acts as an ablation stop layer.

After cleaning, the structure is first provided with a metal seed layer 20 followed by a metallic layer 22. The conditions and elements employed in forming metal seed layer 20 and metallic layer 22 are the same as those mentioned hereinabove. A circuit pattern, as described also hereinabove, is then formed on the metallic layer. The final structure provided using these steps is shown in FIG: 2(c).

While the present invention has been particularly shown and described with respect to preferred embodiments thereof, it will be understood by those skilled in the art that the foregoing and other changes in form and details may be made therein without departing from the spirit and scope of the instant invention.

What is claimed is:

1. A process of fabricating a circuitized structure comprising the steps of:
   (a) applying a dielectric film to at least one surface of an organic substrate having circuitry thereon;
   (b) forming microvias in selective portions of said dielectric film;
   (c) sputtering a metal seed layer on said dielectric film and in said microvias, wherein said sputtering is conducted at a sputtering enerav of from about 0.48 kW to about 0.72 kW, a temperature of from about 100° C. to about 150° C. and for a time of about 12 minutes to about 18 minutes;
   (d) plating a metallic layer on said metal seed layer; and
   (e) forming outer circuitry on said plated metallic layer.

2. The process of claim 1 wherein said circuitry on said substrate is obtained by the steps of: (i) providing a metal foil to said organic substrate; (ii) etching said metal foil so as to thin the same; (iii) providing holes in said substrate; (iv) plating said substrate and said holes with a metallic element thereby forming Plated through holes in said substrate; (v) filling said plated through holes with an epoxy resin containing Cu; and (vi) planarizing the structure.

3. The process of claim 1 wherein said metal seed layer is sputtered under conditions effective to provide a seed layer having a thickness of from about 100 Å to about 2000 Å.

4. The process of claim 3 wherein said metal seed layer has a thickness of from about 500 Å to about 1500 Å.

5. The process of claim 1 wherein said metal seed layer is a metal selected from the group consisting of Cu, Cr, Al and mixtures and alloys thereof.

6. The process of claim 5 wherein said metal seed layer is a layer of Cr and then a layer of Cu.

7. The process of claim 1 wherein said metallic layer has a thickness of from about 0.2 mils to about 0.5 mils.

8. The process of claim 1 wherein said metallic layer is composed of a metal selected from the group consisting of Cu, Al, Cr and W.

9. The process of claim 10 wherein said metallic layer is composed of Cu.

10. The process of claim 1 wherein said outer circuitry is formed by the steps of: (i) providing a photoresist to said metallic layer; (ii) exposing and developing said photoresist; and (iii) etching said metallic layer.

11. A process of fabricating a circuitized structure comprising the steps of:
   (a) providing a dielectric film having a photoimageable layer;
   (b) laminating said photoimageable layer of said dielectric film to at least one surface of an organic substrate having circuitry thereon;
   (c) exposing said photoimageable layer to a pattern of radiation under conditions effective to selectively harden portions of said photoimageable layer;
   (d) providing microvias in areas not harden by step (c);
   (e) curing the photoimageable layer;
   (f) sputtering a metal seed layer on said cured photoimageable layer and in said microvias;
   (g) plating a metallic layer on said metal seed layer; and
   (h) forming a circuit pattern in said metallic layer provided in step (g).

12. The process of claim 11 wherein said photoimageable layer is composed of a epoxy based resin system comprising;
   (a) about 10% to about 80% by weight of a polyol resin which is a condensation product of epichlorohydrin and bisphenol A having a molecular weight of from about 40,000 to about 130,000;
   (b) about 20% to about 90% by weight of an epoxidized multifunctional bisphenol A formaldehyde novolac resin having a molecular weight of from about 4,000 to about 10,000;
   (c) about 0% to about 50% by weight of a halogenated epoxidized diglycidyl ether of bisphenol A having a molecular weight of from about 600 to about 2,500; and
   (d) 0.1 to about 15 parts by weight of the total weight of the epoxy resin system of a cationic photoinitiator.

13. The process of claim 12 wherein said epoxy based resin system further comprises a solvent component, wherein said solvent component comprises propylene glycol monomethyl ether acetate and 0 to less than about 10% propylene carbonate.

14. The process of claim 11 wherein step (c) is carried out at a photo-master pressure of from about 3 psi to about 8 psi, an energy of from about 800 milliJoules/cm$^2$ to about 2000 milliJoules/cm$^2$ using a 365 nanometer arc 8 Kilowatt lamp.

15. The process of claim 14 wherein step (c) is carried out at a photo-master pressure of from about 4 psi to about 6 psi, an energy of from about 1000 milliJoule/cm$^2$ to about 1500 milliJoules/cm$^2$ using a 365 nanometer arc 8 Kilowatt lamp.

16. The process of claim 11 wherein step (d) includes baking and developing said photoimageable layer.

17. The process of claim 16 wherein baking is conducted at a temperature of from about 100° C. to about 140° C. for a time period of about 30 minutes to about 120 minutes.

18. The process of claim 17 wherein baking is conducted at a temperature of from about 120° C. to about 130° C. for a time period of about 30 minutes to about 60 minutes.

19. The process of claim 16 wherein developing is conducted using propylene carbonate, gamma butyrolactone, diglyme or mixtures thereof.

20. The process of claim 11 wherein step (e) is carried out at an energy of from about 2 Joules/cm$^2$ to about 6 Joules/cm$^2$.

21. The process of claim 11 wherein step (e) is conducted at a temperature of from about 150° C. to about 190° C. for a time period of from about 30 minutes to about 120 minutes.

22. The process of claim 21 wherein step (e) is conducted at a temperature of from about 160° C. to about 180° C. for a time period of from about 45 minutes to about 90 minutes.

* * * * *

UNITED STATES PATENT AND TRADEMARK OFFICE
CERTIFICATE OF CORRECTION

PATENT NO. : 6,131,279
DATED : October 17, 2000
INVENTOR(S) : G.W. Jones et al.

It is certified that error appears in the above-identified patent and that said Letters Patent is hereby corrected as shown below:

Title page,
Item [56] References Cited, U.S. PATENT DOCUMENTS:
Insert --

| | | |
|---|---|---|
| 4,870,751 | 10/1989 | Antoon |
| 4,943,346 | 7/1990 | Mattelin |
| 4,965,218 | 10/1990 | Geissberger et al. |
| 5,153,987 | 10/1992 | Takahashi et al. |
| 5,258,094 | 11/1993 | Furui et al. |
| 5,257,452 | 11/1993 | Imai et al. |
| 5,259,110 | 11/1993 | Bross et al. |
| 5,263,243 | 11/1993 | Taneda et al. |
| 5,558,928 | 9/1996 | DiStefano et al. |
| 5,699,613 | 12/1997 | Chong et al. |
| 5,729,897 | 3/1998 | Furui et al. |
| 5,800,726 | 9/1998 | Cotte et al. |
| 5,899,709 | 5/1999 | Yamazaki et al. -- |

Column 7,
Line 26, " 1000" should read -- 100 --

Column 9, claim 1,
Line 46, "enerav" should read -- energy --

Column 9, claim 2,
Line 57, "Plated" should read -- plated --

UNITED STATES PATENT AND TRADEMARK OFFICE
CERTIFICATE OF CORRECTION

PATENT NO.   : 6,131,279
DATED        : October 17, 2000
INVENTOR(S)  : G.W. Jones et al.

It is certified that error appears in the above-identified patent and that said Letters Patent is hereby corrected as shown below:

Column 10, claim 12,
Line 34, "a" should read -- an --

Column 10, claim 13,
Line 53, "10% propylene" should read -- 10% by weight propylene --

Signed and Sealed this

Fifteenth Day of January, 2002

Attest:

Attesting Officer

JAMES E. ROGAN
Director of the United States Patent and Trademark Office